United States Patent
Yu et al.

(10) Patent No.: US 9,455,236 B2
(45) Date of Patent: Sep. 27, 2016

(54) INTEGRATED CIRCUIT PACKAGES AND METHODS OF FORMING SAME

(71) Applicant: Taiwan Semiconductor Manufacturing Company, Ltd., Hsin-Chu (TW)

(72) Inventors: Chen-Hua Yu, Hsin-Chu (TW); Chien-Hsun Lee, Chu-tung Town (TW); Tsung-Ding Wang, Tainan (TW); Jung Wei Cheng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 29 days.

(21) Appl. No.: 14/546,937

(22) Filed: Nov. 18, 2014

(65) Prior Publication Data

US 2015/0364436 A1      Dec. 17, 2015

Related U.S. Application Data

(60) Provisional application No. 62/011,933, filed on Jun. 13, 2014.

(51) Int. Cl.
| | |
|---|---|
| *H01L 21/78* | (2006.01) |
| *H01L 23/00* | (2006.01) |
| *H01L 21/00* | (2006.01) |
| *H01L 21/768* | (2006.01) |
| *H01L 21/683* | (2006.01) |

(52) U.S. Cl.
CPC ............ *H01L 24/11* (2013.01); *H01L 21/6836* (2013.01); *H01L 21/76831* (2013.01); *H01L 21/76879* (2013.01); *H01L 21/76883* (2013.01); *H01L 21/76898* (2013.01); *H01L 21/78* (2013.01); *H01L 2224/111* (2013.01); *H01L 2224/113* (2013.01); *H01L 2224/1146* (2013.01); *H01L 2924/01022* (2013.01); *H01L 2924/01029* (2013.01)

(58) Field of Classification Search
CPC .................... G06F 17/5077; H01L 21/76879; H01L 21/78677; H01L 24/11; H01L 2924/01022; H01L 2224/1146; H01L 2924/01029; H01L 2224/111; H01L 2224/113; H01L 2224/73265; H01L 2224/48227; H01L 21/76898; H01L 21/76831; H01L 21/6836; H01L 21/76883; H01L 21/78
USPC ........................................................ 438/637
See application file for complete search history.

(56) References Cited

U.S. PATENT DOCUMENTS 7,838,991 B1 *  11/2010  Mostafazadeh ......... H01L 24/03
                                                257/737

* cited by examiner

*Primary Examiner* — Caleen Sullivan
(74) *Attorney, Agent, or Firm* — Slater Matsil, LLP

(57) ABSTRACT

Integrated circuit (IC) packages and methods of forming the IC packages are provided. In an embodiment, IC dies are formed and are placed on a carrier to form a packaged semiconductor device. An encapsulant is formed over the IC dies and between the neighboring IC dies. The encapsulant and the IC dies are planarized to expose contacts on top surfaces of the IC dies, and redistribution layers (RDLs) are formed over the planarized encapsulant and the planarized IC dies. Openings are formed in a topmost dielectric layer of the RDLs to expose interconnects in the RDL, and a conductive seed layer is formed over the RDL and in the openings. Connectors of a first type and connectors of a second type are formed over the seed layer in the openings. The packaged semiconductor device is diced into individual IC packages.

20 Claims, 15 Drawing Sheets

INTEGRATED CIRCUIT PACKAGES AND METHODS OF FORMING SAME

PRIORITY CLAIM AND CROSS-REFERENCE

This application claims the benefit of U.S. Provisional Application Ser. No. 62/011,933, filed on Jun. 13, 2014, entitled "Composite Bump Design and Process Flow for Packaged Device," which application is hereby incorporated herein by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DICs), have emerged as an effective alternative to further reduce the physical size of a semiconductor device. In a stacked semiconductor device, wafers/dies are stacked on top of one another and are interconnected using through connections such as through vias (TVs). Some of the benefits of 3DICs, for example, include exhibiting a smaller footprint, reducing power consumption by reducing the lengths of signal interconnects, and improving yield and fabrication cost if individual dies are tested separately prior to assembly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
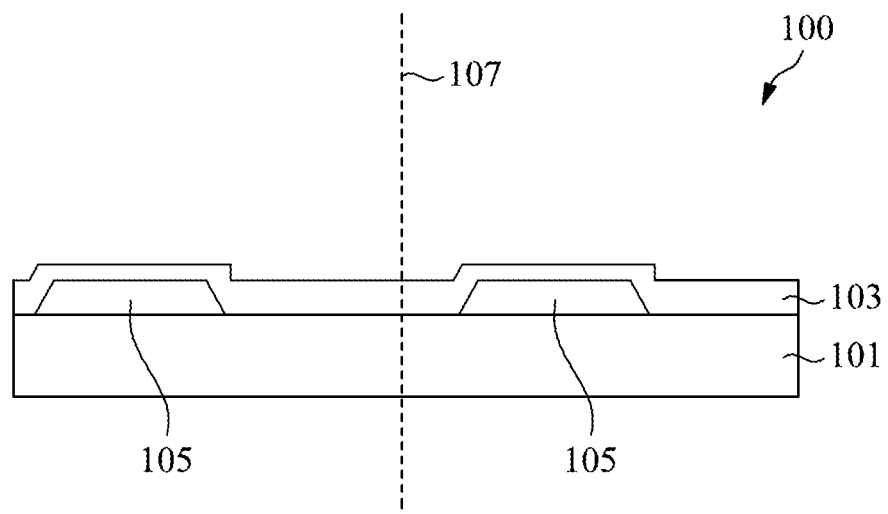
FIGS. 1-17 are cross-sectional views of various processing steps during fabrication of integrated circuit packages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely an integrated circuit package such as an integrated fan-out (InFO) package. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

FIGS. 1-17 are cross-sectional views of various processing steps during fabrication of integrated circuit packages in accordance with some embodiments. In particular, FIGS. 1-6 are cross-sectional views of various processing steps during fabrication of integrated circuit dies in accordance with some embodiments, and FIGS. 7-17 are cross-sectional views of various processing steps during fabrication of integrated circuit packages using the dies fabricated in FIGS. 1-6 in accordance with some embodiments.

Turning first to FIG. 1, a portion of a semiconductor device 100 is illustrated. In the illustrated embodiments, the semiconductor device 100 comprises a processed wafer 101 having contact pads 105 formed thereon and a passivation layer 103 formed over the processed wafer 101 and the contact pads 105.

In some embodiments, the processed wafer 101 comprises a substrate, various active and passive devices on the substrate, and various metallization layers over the substrate, which are not explicitly illustrated in FIG. 1 as their inclusion is not necessary for understanding various embodiments described below. The substrate may be formed of silicon, although it may also be formed of other group III, group IV, and/or group V elements, such as silicon, germanium, gallium, arsenic, and combinations thereof. The substrate may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

In some embodiments, the variety of active and passive devices may include various n-type metal-oxide semiconductor (NMOS) and/or p-type metal-oxide semiconductor (PMOS) devices such as transistors, capacitors, resistors, diodes, photo-diodes, fuses and/or the like.

The metallization layers may include an inter-layer dielectric (ILD)/inter-metal dielectric layers (IMDs) formed over the substrate. The ILD/IMDs may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma enhanced CVD (PECVD).

In some embodiments, interconnect structures may be formed in the ILD/IMDs using, for example, a damascene process, a dual damascene process, or the like. The ILD/IMDs may be patterned using photolithography techniques to form trenches and vias. The interconnect structures are formed by depositing a suitable conductive material in the trenches and the vias of the ILD/IMDs using various deposition and plating methods, or the like. In addition, the interconnect structures may include one or more barrier/adhesion layers (not shown) to protect the ILD/IMDs from diffusion and metallic poisoning. The one or more barrier/adhesion layers may comprise titanium, titanium nitride, tantalum, tantalum nitride, or other alternatives. The barrier layer may be formed using physical vapor deposition (PVD), atomic layer deposition (ALD), sputtering, or the like. The conductive material of the interconnect structures may comprise copper, a copper alloy, silver, gold, tungsten, tantalum, aluminum, and the like. In an embodiment, the steps for forming the interconnect structures may include blanket forming the one or more barrier/adhesion layers, depositing a thin seed layer of a conductive material, and filling the trenches and the vias in the ILD/IMDs with the conductive material, for example, by plating. A chemical-mechanical polishing (CMP) is then performed to remove excess portions of the interconnect structures. In some embodiments, the interconnect structures may provide electrical connections between the various passive and active devices formed on the substrate.

In some embodiments, the processed wafer 101 may be a logic wafer, a memory wafer, a sensor wafer, an analog wafer, or the like. The processed wafer 101 may be formed using a complementary metal-oxide-semiconductor (CMOS) process, a micro-electro-mechanical systems (MEMS) process, a nano-electro-mechanical systems (NEMS) process, the like, or a combination thereof. As described below in greater detail, the processed wafer 101 will be singulated along scribe lines 107 (only one scribe line is illustrated in FIG. 1) to form individual dies, which subsequently will be packaged to form integrated circuit packages.

Referring further to FIG. 1, the contact pads 105 are formed on the processed wafer 101. The contact pads 105 electrically couple the processed wafer 101 to external circuitry as described below in greater detail. The contact pads 105 may comprise a conductive material such as copper, tungsten, aluminum, silver, gold, the like, or a combination thereof, and may be formed by an electrochemical plating process, an electroless plating process, ALD, PVD, the like, or a combination thereof. In some embodiments, the contact pads 105 may further comprise a thin seed layer (not shown), wherein the conductive material of the contact pads 105 is deposited over the thin seed layer. The seed layer may comprise copper, titanium, nickel, gold, manganese, the like, or a combination thereof, and may be formed by ALD, PVD, sputtering, the like, or a combination thereof.

In the illustrated embodiment, the conductive material of the contact pads 105, such as aluminum, is deposited over the processed wafer 101 and patterned to form the contact pads 105 as illustrated in FIG. 1. The contact pads 105 may be patterned using photolithography techniques. Generally, photolithography techniques involve depositing a photoresist material, which is subsequently irradiated (exposed) and developed to remove a portion of the photoresist material. The remaining photoresist material protects the underlying material, such as the conductive material of the contact pads 105, from subsequent processing steps, such as etching. A suitable etching process, such as a reactive ion etch (RIE) or other dry etch, an isotropic or anisotropic wet etch, or any other suitable etch or patterning process may be applied to the conductive material of the contact pads 105 to remove the exposed portion of the conductive material and form the contact pads 105. For example, exposed portions of the conductive material such as aluminum may be etched using a mixture of 80% phosphoric acid, 5% nitric acid, 5% acetic acid, and 10% de-ionized (DI) water.

In other embodiments, the contact pads 105 may be formed using alternative methods. For example, a photoresist material may be deposited over the processed wafer 101, and subsequently irradiated (exposed) and developed to remove a portion of the photoresist material to form openings. The openings in the photoresist material are then filled with a conductive material to form the contact pads 105.

In some embodiments, the passivation layer 103 is formed over the processed wafer 101 and the contact pads 105. In the illustrated embodiments, the passivation layer 103 may comprise photo-patternable dielectric materials such as polyimide, benzocyclobutene (BCB), polybenzoxazole (PBO), the like, or a combination thereof. In other embodiments, the passivation layer 103 may comprise non-photo-patternable dielectric materials such as silicon nitride, silicon carbide, silicon oxide, silicon oxynitride, low-k dielectrics such as carbon doped oxides, extremely low-k dielectrics such as porous carbon doped silicon dioxide, the like, or a combination thereof. The passivation layer 103 may be deposited by CVD, PVD, ALD, a spin-on-dielectric process, the like, or a combination thereof.

In other embodiments, the contact pads 105 may be formed after the passivation layer 103 is formed on the processed wafer 101. For example, the contact pads 105 comprising copper may be formed in the passivation layer 103 using a damascene process, which is known in the art and the description is not repeated herein.

Figure 2:
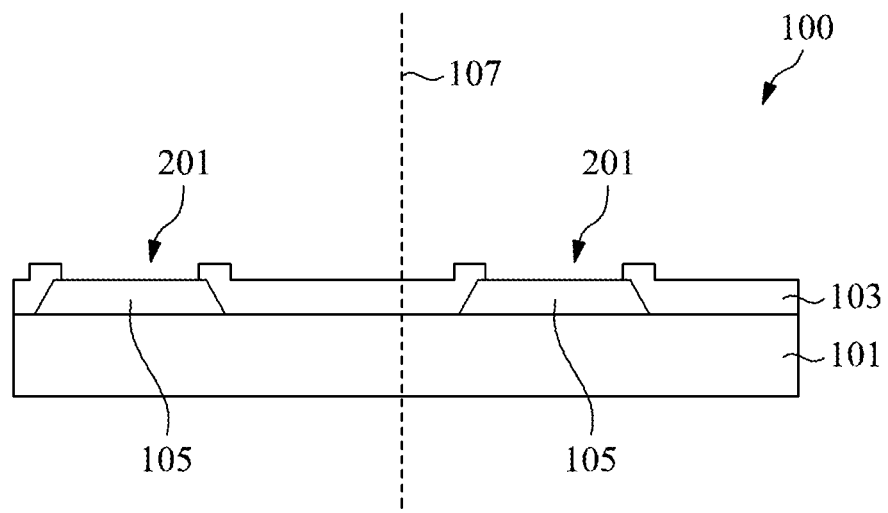

Referring to FIG. 2, first openings 201 are formed in the passivation layer 103 to expose the contact pads 105. In an embodiment with the passivation layer 103 formed of a photo-patternable material, the first openings 201 may be formed using a suitable photolithography technique to expose the passivation layer 103 to light. In such an embodiment, the passivation layer 103 is developed and/or cured after the exposure.

Variety of alternative methods may be used to form the first openings 201 in the passivation layer 103. For example, in an embodiment with the passivation layer 103 formed of a non-photo-patternable material, a photoresist material (not shown) is formed over the passivation layer 103. The photoresist material is subsequently irradiated (exposed) and developed to remove a portion of the photoresist material. Subsequently, exposed portions of the passivation layer 103 are removed using, for example, a suitable etching process to form the first openings 201. In some embodiments, the passivation layer 103 formed of silicon oxide is etched using, for example, buffered hydrofluoric acid (HF). In other embodiments, the passivation layer 103 formed of silicon nitride is etched using, for example, hot phosphoric acid ($H_3PO_4$).

Figure 3:
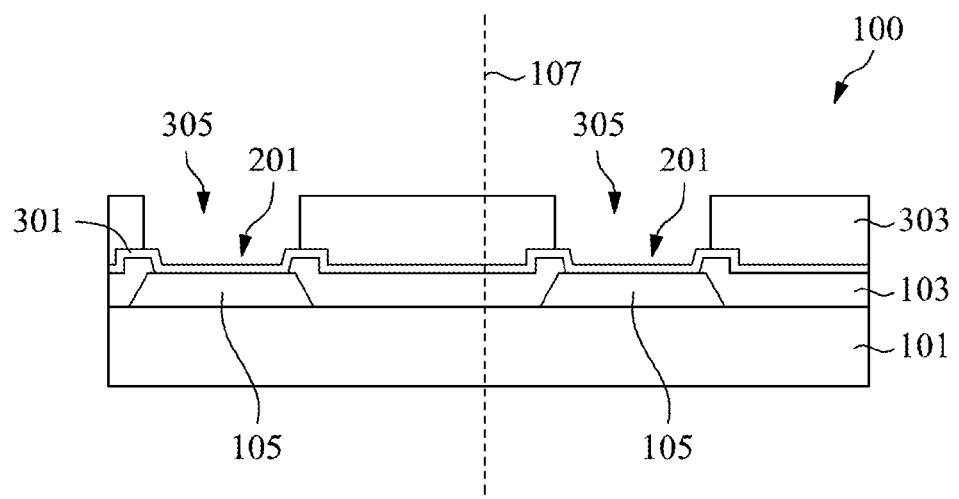

Referring to FIG. 3, a first seed layer 301 is blanket formed over the passivation layer 103 and the first openings 201. The first seed layer 301 may comprise one or more layers of copper, titanium, nickel, gold, manganese, the like, or a combination thereof, and may be formed by ALD, PVD, sputtering, the like, or a combination thereof. In some embodiments, the first seed layer 301 comprises a layer of copper having a thickness between about 0.3 µm and about 0.5 µm, such as about 0.3 µm, formed over a layer of titanium having a thickness between about 0.05 µm and about 0.1 µm, such as about 0.05 µm.

Referring further to FIG. 3, a first patterned mask 303 is formed over the first seed layer 301. In some embodiments, the first patterned mask 303 comprises a photoresist material, or any photo-patternable material. A material of the first patterned mask 303 is deposited, irradiated (exposed) and developed to remove portions of the material and form second openings 305, thereby forming the first patterned mask 303. In the illustrated embodiment, the second openings 305 expose portions of the first seed layer 301 formed over the contact pads 105 in the first openings 201. As discussed in greater detail below, conductive vias (such as conductive vias 401 illustrated in FIG. 4) will be formed in the second openings 305 and remaining first openings 201 to provide electrical contacts to the contact pads 105.

Figure 4:
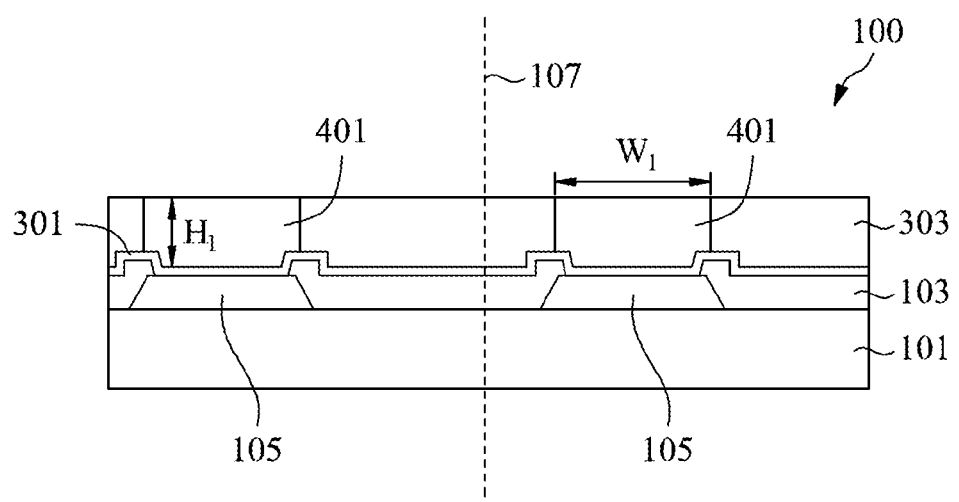

Referring to FIG. 4, conductive vias 401 are formed in the second openings 305 and the remaining first openings 201. In some embodiments, the second openings 305 and the remaining first openings 201 (see FIG. 3) are filled with a conductive material such as copper, tungsten, aluminum, silver, gold, the like, or a combination thereof, using an electro-chemical plating process, an electroless plating process, ALD, PVD, the like, or a combination thereof. The second openings 305 may be over-filled with the conductive material, which may be removed using an etch process, a planarization process (e.g., a CMP process), or the like, using the first patterned mask 303 as a stop layer. In some embodiments, the conductive vias 401 have a first width $W_1$ between about 20 µm and about 70 µm, such as about 30 µm, and a first height $H_1$ between about 5 µm and about 50 µm, such as about 15 µm.

Figure 5:
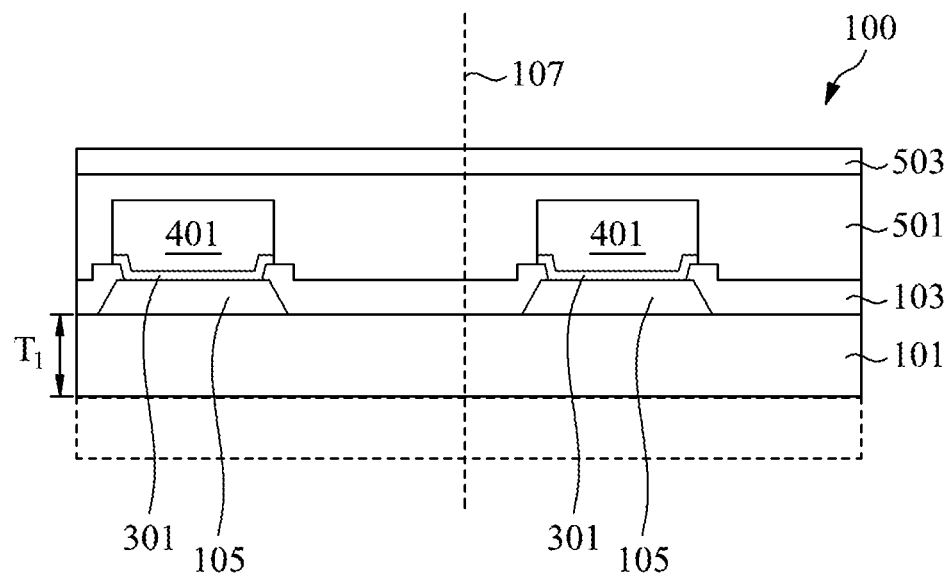

Referring to FIG. 5, the first patterned mask 303 is then removed and a protective layer 501 is formed over the processed wafer 101. In some embodiments, the first patterned mask 303 comprising a photoresist material is removed using, for example, an ashing process followed by a wet clean process. Subsequently, exposed portions of the first seed layer 301 are removed using, for example, a wet or dry etch. In an embodiment with the first seed layer 301 comprising a copper layer formed over a titanium layer, the first seed layer 301 may be etched using, for example, a mixture of $FeCl_3$, HCl, and $H_2O$ (for etching copper) and a mixture of $H_2O_2$, HF, and $H_2O$ (for etching titanium). The protective layer 501 may comprise dielectric materials such as polyimide, benzocyclobutene (BCB), polybenzoxazole (PBO), the like, or a combination thereof, and may be formed using a spin-on coating technique, or the like.

In some embodiments, it is desirable to back grind the processed wafer 101, for example, to reduce the thickness of the semiconductor device 100, and thicknesses of subsequently formed integrated circuit dies. FIG. 5 further illustrates a thinning process wherein a tape 503 such as a back grinding (BG) tape is applied to the top surface of protective layer 501, and the back side of the processed wafer 101 is thinned by grinding, etching, CMP, or the like. In some embodiments, the tape 503 protects the semiconductor device 100 from contamination caused by grinding fluids and/or debris. In the illustrated embodiment, the processed wafer 101 is thinned to a first thickness $T_1$ between about 50 µm and about 780 µm, such as about 250 µm.

Figure 6:
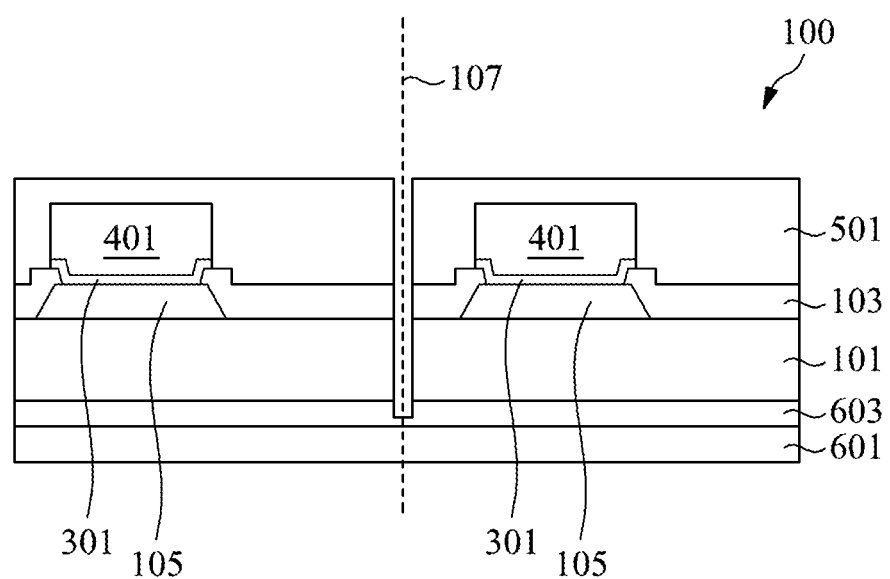

Referring to FIG. 6, after the back grinding process described above is completed the tape 503 is removed and the semiconductor device 100 is singulated to form individual dies. The semiconductor device 100 is attached to a frame 601 using an adhesive 603 to prepare the semiconductor device 100 for a subsequent dicing process. In some embodiments, the frame 601 may be a film frame or any suitable carrier to provide mechanical support for subsequent operations, such as dicing. The adhesive 603 may be a die attach film or any suitable adhesive, epoxy, ultraviolet (UV) glue (which loses its adhesive property when exposed to UV radiation), or the like, and may be formed using a deposition process, a spin coating, a printing process, a lamination process, or the like. In some embodiments, the adhesive 603 may have a multilayer structure and may comprise a release layer (not show). The release layer may help to safely remove individual dies from the frame 601 after the dicing process is completed. In some embodiments, the release layer may be a UV type, wherein adhesive strength of the release layer is substantially reduced after exposing the release layer to UV radiation. In other embodiments, the release layer may be a thermal type, wherein adhesive strength of the release layer is substantially reduced after exposing the release layer to a suitable heat source. In some embodiments, the semiconductor device may be singulated into individual dies, for example, by sawing, laser ablation, or the like. Subsequently, each of the dies is tested to identify known good dies (KGDs) for further processing.

Figure 7:
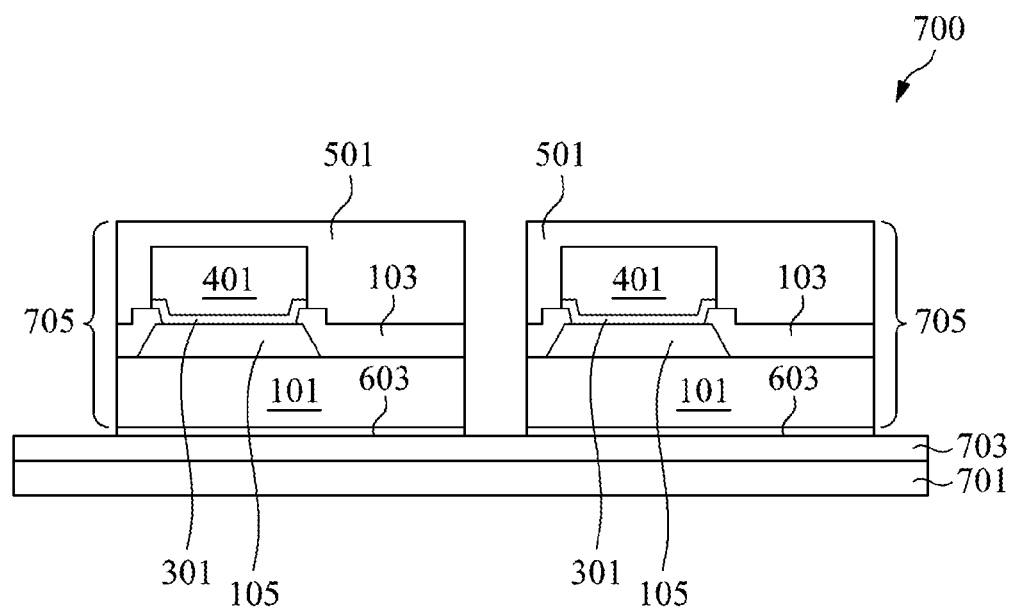

After the dicing process is completed and the KGDs are identified, KGDs are placed on a carrier for further processing to form a packaged semiconductor device. Referring to FIG. 7, a portion a carrier 701 is illustrated, wherein two KGDs 705 are placed to start forming the packaged semiconductor device 700. In some embodiments, the KGDs 705 are attached to the carrier 701 using, for example, a pick and place apparatus. In other embodiments, the KGDs 705 may be attached to the carrier 701 manually, or using any other suitable method.

As shown in FIG. 7, each of the KGDs 705 comprises a single passivation layer (such as the passivation layer 103), a single contact pad (such as the contact pad 105), a single conductive via (such as the conductive via 401), and a single protective layer (such as the protective layer 501). One skilled in the art will recognize that numbers of passivation layers, contact pads, conductive vias, and the protective layers are provided for illustrative purpose only and are not limiting the scope of the present disclosure. In other embodiments, each of the KGDs 705 may comprise appropriate number of passivation layers, contact pads, conductive vias, and the protective layers depending on design requirements for the KGDs 705.

Referring further to FIG. 7, the carrier 701 may be formed of quartz, glass, or the like, and provides mechanical support for subsequent operations. In some embodiments, a release layer 703 may be formed on the carrier 701. The release layer 703 is subsequently used to debond the carrier 701 from the packaged semiconductor device 700 after all the packaging processes are completed. In some embodiments, the release layer 703 may comprise a light to heat conversion (LTHC) material, a UV adhesive, or the like. The release layer 703 may be formed using a deposition process, a spin coating, a printing process, a lamination process, or the like. In some embodiments, the release layer 703 formed of a LTHC material when exposed to light partially or fully loses its adhesive strength and the carrier 701 can be easily removed from the back side of the packaged semiconductor device 700.

Figure 8:
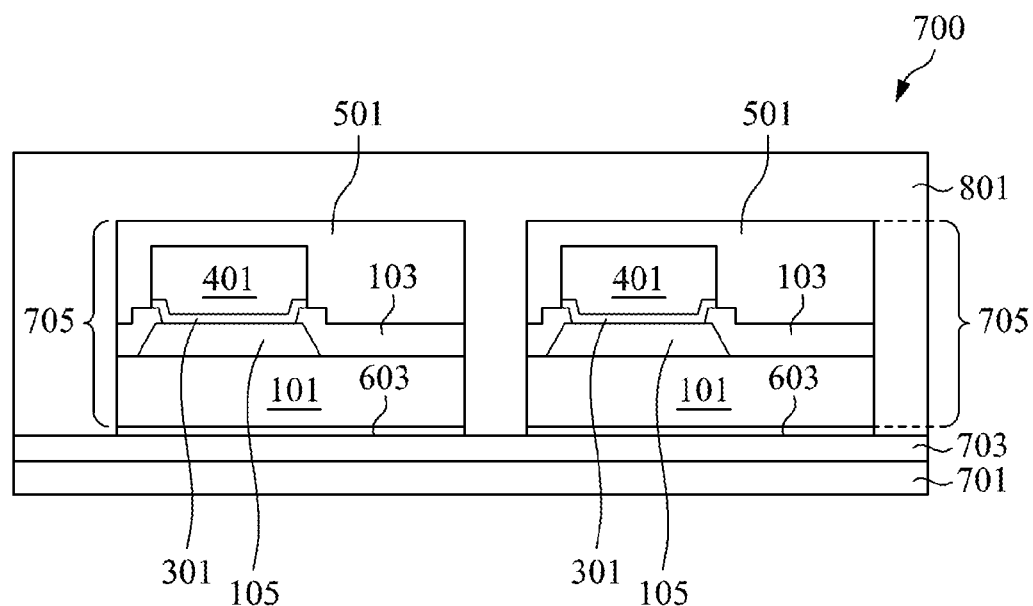

FIG. 8 illustrates, an encapsulant 801 formed over the carrier 701 and the KGDs 705 and fills gaps between the KGDs 705. In some embodiments, the encapsulant 801 may comprise a molding compound such as an epoxy, a resin, a moldable polymer, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the KGDs 705.

In some embodiments, portions of the protective layers 501 and the encapsulant 801 extending over top surfaces of the conductive vias 401 may be removed using a CMP, a grinding process, an etch process, or another suitable thinning process to expose the conductive vias 401. In some embodiment, the above process is performed until the top surfaces of the conductive vias 401 are substantially coplanar with top surfaces of the protective layers 501 and a top surface of the encapsulant 801 as illustrated in FIG. 9.

Figure 9:
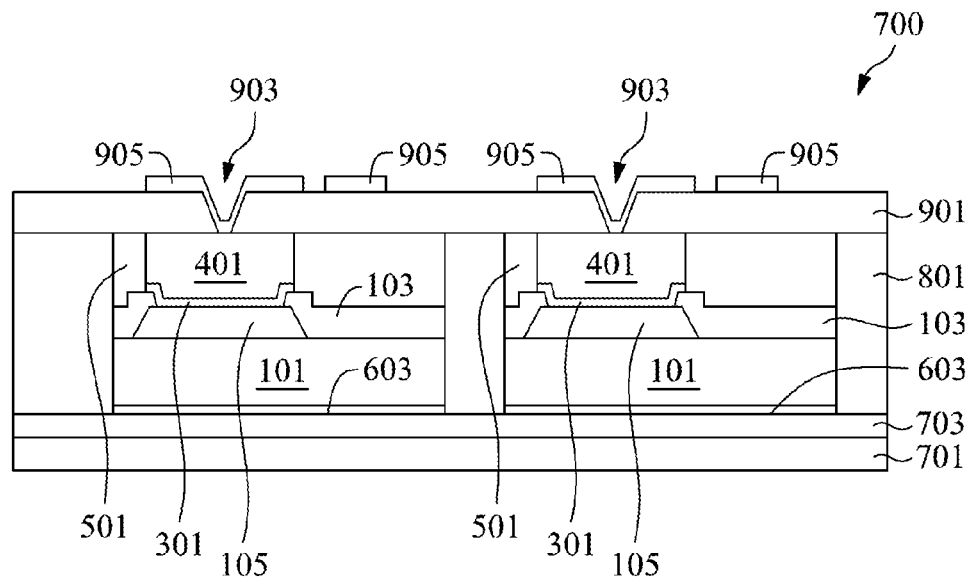
Figure 10:
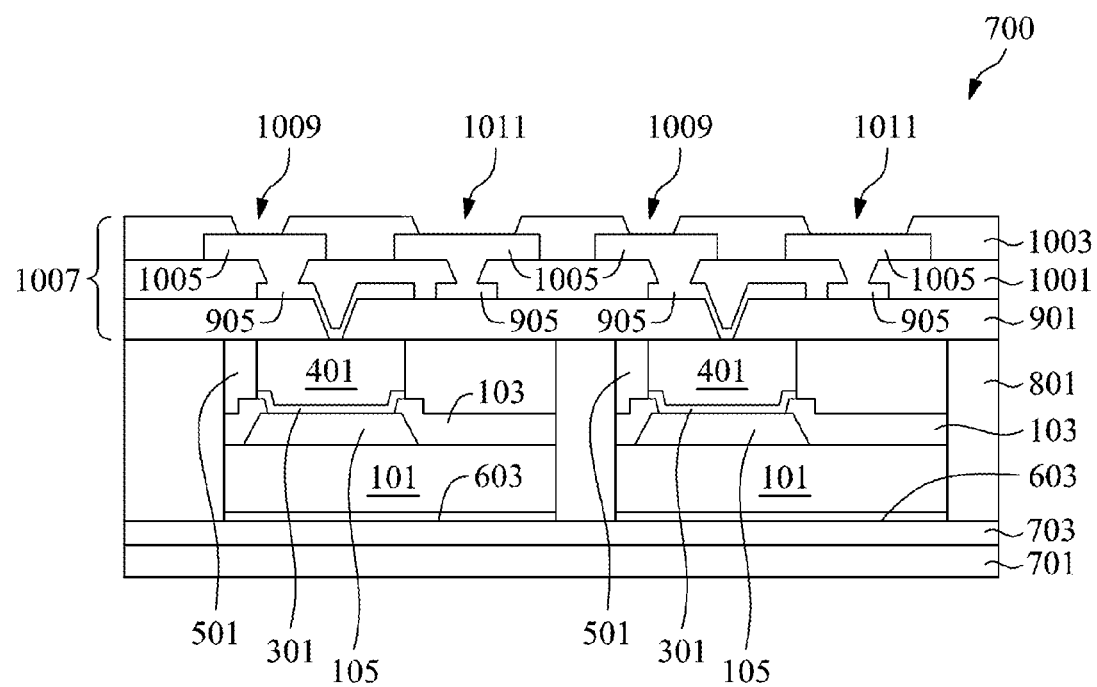

In FIGS. 9 and 10 illustrate formation of redistribution layers (RDLs) 1007 (illustrated in FIG. 10) over the KGDs 705 and the encapsulant 801. As described in greater detail below, the RDLs 1007 comprise one or more dielectric layers and one or more conductive features disposed within the one or more dielectric layers. Referring first to FIG. 9, a first dielectric layer 901 is formed over the KGDs 705, and the encapsulant 801. In the illustrated embodiment, the first dielectric layer 901 may be formed using materials and methods similar to those of the passivation layer 103 and the description is not repeated herein. In the illustrated embodiment, the first dielectric layer 901 is formed of a photo-patternable material. Third openings 903 are formed in the first dielectric layer 901 to expose the conductive vias 401. The third openings 903 may be formed using, for example, a photolithography technique similar to that used to form the first openings 201 in the passivation layer 103 (see FIG. 2) and the description is not repeated herein.

Referring further to FIG. 9, a first conductive pattern 905 is formed over the first dielectric layer 901 and in the third openings 903 to contact the conductive vias 401. The first conductive pattern 905 may comprise various lines/traces (running "horizontally" across a top surface of the first dielectric layer 901) and/or vias (extending "vertically" into the third openings 903 in the first dielectric layer 901, and contacting the underlying conductive vias 401). In some embodiments, a seed layer (not shown) is deposited over the first dielectric layer 901 and in the third openings 903. The seed layer may comprise copper, titanium, nickel, gold, manganese, the like, or a combination thereof, and may be formed by ALD, sputtering, PVD process, the like, or a combination thereof. Subsequently, a photoresist material (not shown) is deposited over the seed layer and patterned to define the desired pattern for the first conductive pattern 905. A conductive material, such as copper, tungsten, aluminum, silver, gold, the like, or a combination thereof, and is formed on the seed layer by an electro-chemical plating process, an electroless plating process, ALD, PVD, the like, or a combination thereof. The photoresist material is removed using appropriate photoresist removal process, such as ashing followed by a wet clean process. Exposed portions of the seed layer over the first dielectric layer 901 are removed using, for example, a wet or dry etch.

Referring to FIG. 10, a second dielectric layer 1001, third dielectric layer 1003, and a second conductive pattern 1005 are formed over the first dielectric layer 901 and the first conductive pattern 905, which completes formation of the RDLs 1007. In the illustrated embodiment, the second dielectric layer 1001 and third dielectric layer 1003 are similar to the first dielectric layer 901, may be formed using similar methods and the description is not repeated herein. The second conductive pattern 1005 may be formed using materials and formation methods similar to those of the first conductive pattern 905 and the description is not repeated herein. The second conductive pattern 1005 extends through the second dielectric layer 1001 and contacts portions of the first conductive pattern 905, as illustrated in FIG. 10.

As shown in FIG. 10, the RDLs 1007 comprise three dielectric layers (such as the first dielectric layer 901, the second dielectric layer 1001, and third dielectric layer 1003) and two conductive patterns (such as the first conductive pattern 905 and the second conductive pattern 1005) interposed between respective dielectric layers. One skilled in the art will recognize that the number of dielectric layers and the number of conductive patterns are provided for illustrative purpose only and are not limiting the scope of the present disclosure. In other embodiments, the RDLs 1007 may comprise appropriate number of dielectric layers and conductive patterns depending on design requirements for the packaged semiconductor device 700.

Referring further to FIG. 10, fourth openings 1009 and fifth openings 1011 are formed in the third dielectric layer 1003 to expose portions of the second conductive pattern 1005. The fourth openings 1009 and the fifth openings 1011 may be formed using, for example, a photolithography technique similar to that used to form the first openings 201 in the passivation layer 103 (see FIG. 2) and the description is not repeated herein. In some embodiments, the fourth openings 1009 and the fifth openings 1011 are formed using a single-step patterning method. In other embodiments, the fourth openings 1009 and the fifth openings 1011 are formed using a two-step patterning methods, a first step forming the fourth openings 1009 and a second step forming the fifth openings 1011. As described below in greater detail, connectors will be formed in the fourth openings 1009 and the fifth openings 1011 to contact the second conductive pattern 1005 of the RDLs 1007 and provide electrical connection between the packaged semiconductor device 700 and external devices such as integrated circuit dies, package substrates, integrated circuit packages, or the like. In the illustrated embodiment, a width of the fifth openings 1011 is larger than a width of the fourth openings 1009 as shown in FIG. 10.

Figure 11:
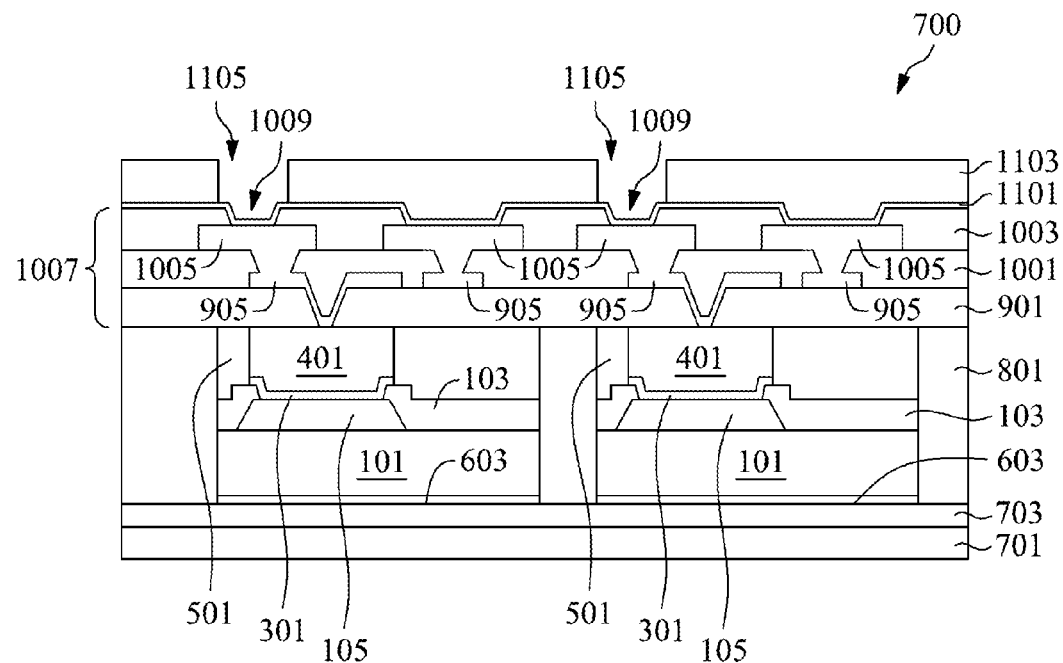

Referring to FIG. 11, a second seed layer 1101 is blanket formed over the third dielectric layer 1003, in the fourth openings 1009 and in the fifth openings 1011. The second seed layer 1101 may comprise one or more layers of copper, titanium, nickel, gold, manganese, the like, or a combination thereof, and may be formed by ALD, PVD, sputtering, the like, or a combination thereof. In some embodiments, the second seed layer 1101 comprises a layer of copper having a thickness between about 0.3 µm and about 0.5 µm, such as about 0.3 µm, formed over a layer of titanium having a thickness between about 0.05 µm and about 0.1 µm, such as about 0.05 µm.

Referring further to FIG. 11, a second patterned mask 1103 is formed over the second seed layer 1101. In some embodiments, the second patterned mask 1103 comprises a photoresist material, or any photo-patternable material. A material of the second patterned mask 1103 is deposited, irradiated (exposed) and developed to remove portions of the material and form first connector openings 1105. The first connector openings 1105 expose portions of the second seed layer 1101 in the fourth openings 1009 of the third dielectric layer 1003 as illustrated in FIG. 11.

Figure 12:
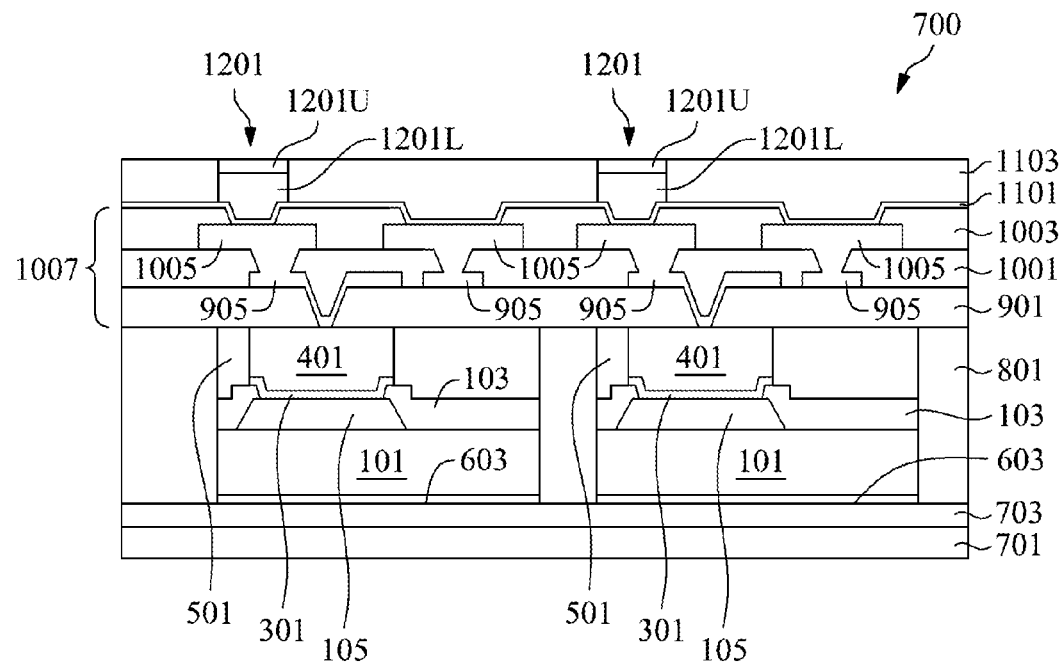

Referring to FIG. 12, first connectors 1201 are formed in combined openings formed by first connector openings 1105 and the fourth openings 1009 (see FIG. 11). In the illustrated embodiment, the first connectors 1201 have first lower portions 1201L comprising a conductive material and first upper portions 1201U comprising a solder material. The first lower portions 1201L and the first upper portions 1201U may be also referred as conductive pillars 1201L and solder caps 1201U, respectively. In alternative embodiments, the first connectors 1201 may be micro-bumps, solder balls, or the like.

In some embodiments, the combined openings are filled with a conductive material such as copper, tungsten, aluminum, silver, gold, the like, or a combination thereof, using an electro-chemical plating process, an electroless plating process, ALD, PVD, the like, or a combination thereof. In the illustrated embodiment, the combined openings are not fully filled with the conductive material and remaining portions of the combined openings are filled with a solder material. The solder materials may be lead-based solders such as PbSn compositions, lead-free solders including InSb, tin, silver, and copper ("SAC") compositions, and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free solders also include SnCu compounds, without the use of silver (Ag), and SnAg compounds, without the use of copper (Cu).

Figure 13:
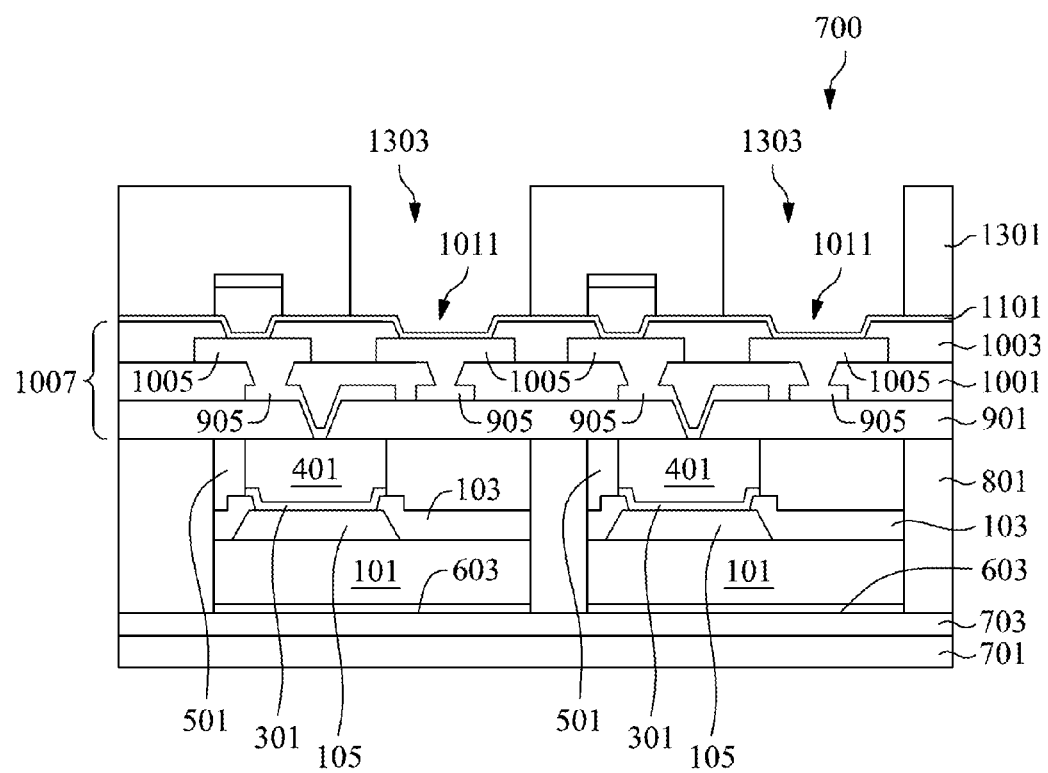

Referring to FIG. 13, the second pattern mask 1103 (see FIG. 12) is removed from the packaged semiconductor device 700 and a third patterned mask 1301 is formed over the second seed layer 1101 and the first connectors 1201. In some embodiments, the second patterned mask 1103 is removed using, for example, an ashing process followed by a wet clean process. In some embodiments, the third patterned mask 1301 comprises a photoresist material, or any photo-patternable material. A material of the third patterned mask 1301 is deposited, irradiated (exposed) and developed to remove portions of the material and form second connector openings 1303. The second connector openings 1303 expose portions of the second seed layer 1101 in the fifth openings 1011 of the third dielectric layer 1003 as illustrated in FIG. 13.

Figure 14:
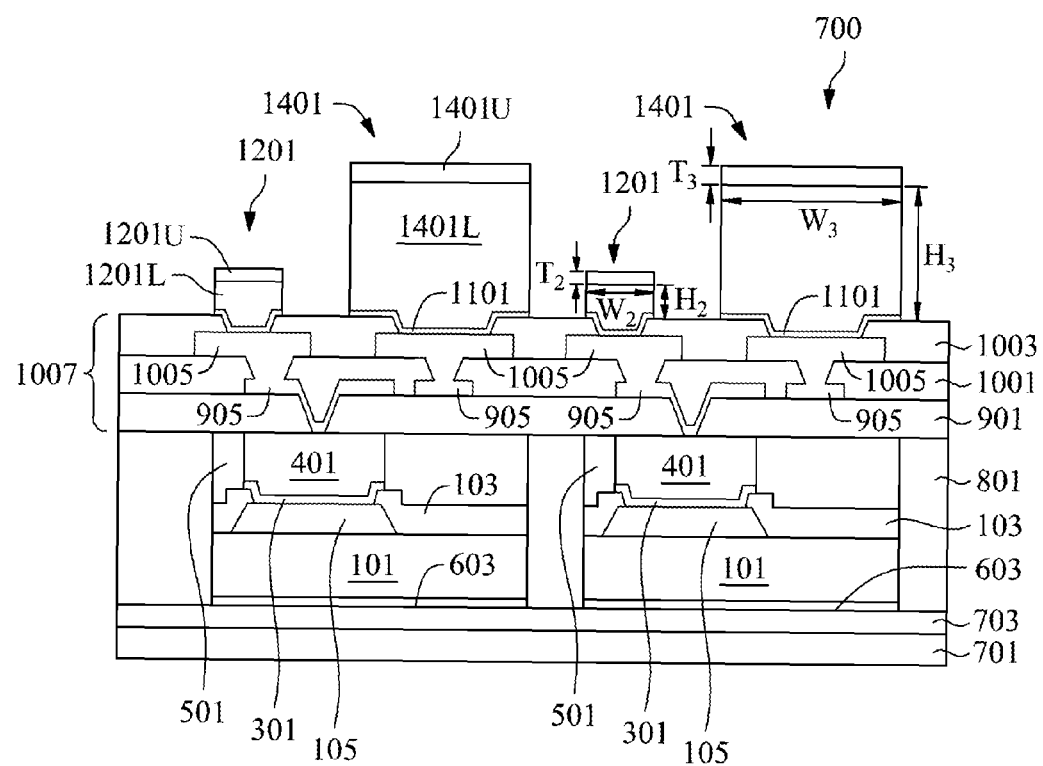

Referring to FIG. 14, second connectors 1401 are formed in combined openings formed by second connector openings 1303 and the fifth openings 1011 (see FIG. 13). In the illustrated embodiment, the second connectors 1401 are formed using materials and formation methods similar to those of the first connectors 1201 and the description is not repeated herein. As shown in FIG. 14, in the illustrated embodiment, second connectors 1401 have second lower portions 1401L comprising a conductive material and second upper portions 1401U comprising a solder material. The second lower portions 1401L and the second upper portions 1401U may be also referred as conductive pillars 1401L and solder caps 1401U, respectively. In alternative embodiments, the second connectors 1401 may be controlled collapse chip connection (C4) bumps, or the like. After the second connectors 1401 are formed, the third patterned mask 1301 formed of a photoresist material is removed using, for example, an ashing process followed by a wet clean process. Subsequently, exposed portions of the second seed layer 1101 are removed using, for example, a wet or dry etch, and portions of the third dielectric layer 1003 are exposed. In an embodiment with the second seed layer 1101 comprising a copper layer formed over a titanium layer, the second seed layer 1101 may be etched using, for example, a mixture of $FeCl_3$, HCl, and $H_2O$ (for etching copper) and a mixture of $H_2O_2$, HF, and $H_2O$ (for etching titanium).

Referring further to FIG. 14, in some embodiments, the first lower portions 1201L of the first connectors 1201 have a second height $H_2$ between about 3 µm and about 50 µm, and a second width $W_2$ between about 10 µm and about 50 µm. The first upper portions 1201U of the first connectors 1201 may have a second thickness $T_2$ between about 3 µm and about 50 µm. In some embodiments, the second lower portions 1401L of the second connectors 1401 have a third height $H_3$ between about 5 µm and about 600 µm, and a third width $W_3$ between about 40 µm and about 600 µm. The second upper portions 1401U of the second connectors 1401 may have a third thickness $T_3$ between about 5 µm and about 100 µm.

As described above with reference to FIGS. 10-14, each type of the connectors (such as the first connectors 1201 and the second connectors 1401) is formed using a single patterned mask (such as the second patterned mask 1103 for the first connectors 1201, or the third patterned mask 1301 for the second connectors 1401) and a single filling process. In some embodiments, each type of the connectors may be formed utilizing multiple patterned masks and/or multiple filling processes. For example, in some embodiments, each type of the connectors is formed using multiple cycles, each of the cycles comprising forming a patterned mask and filling openings in the patterned mask with a conductive material. In addition, during the final cycle, a topmost patterned mask may be also filled with a solder material. Moreover, widths of the openings in each patterned mask may vary gradually or in a step-like manner with each cycle. Accordingly, the first connectors 1201 and the second connectors 1401 may have variety of structures as described below in greater detail with reference to FIGS. 19A and 19B.

In alternative embodiments, each type of the connectors (such as the first connectors 1201 and the second connectors 1401) is formed using a single patterned mask (such as the second patterned mask 1103 for the first connectors 1201 or the third patterned mask 1301 for the second connectors 1401) and a single filling process. However, the single patterned mask may be formed using a multiple patterning process to form openings of variety of shapes and widths. The openings are then filled with a conductive material and a solder material to form the connectors. Accordingly, the first connectors 1201 and the second connectors 1401 may have variety of structures as described below in greater detail with reference to FIGS. 19A and 19B.

Figure 15:
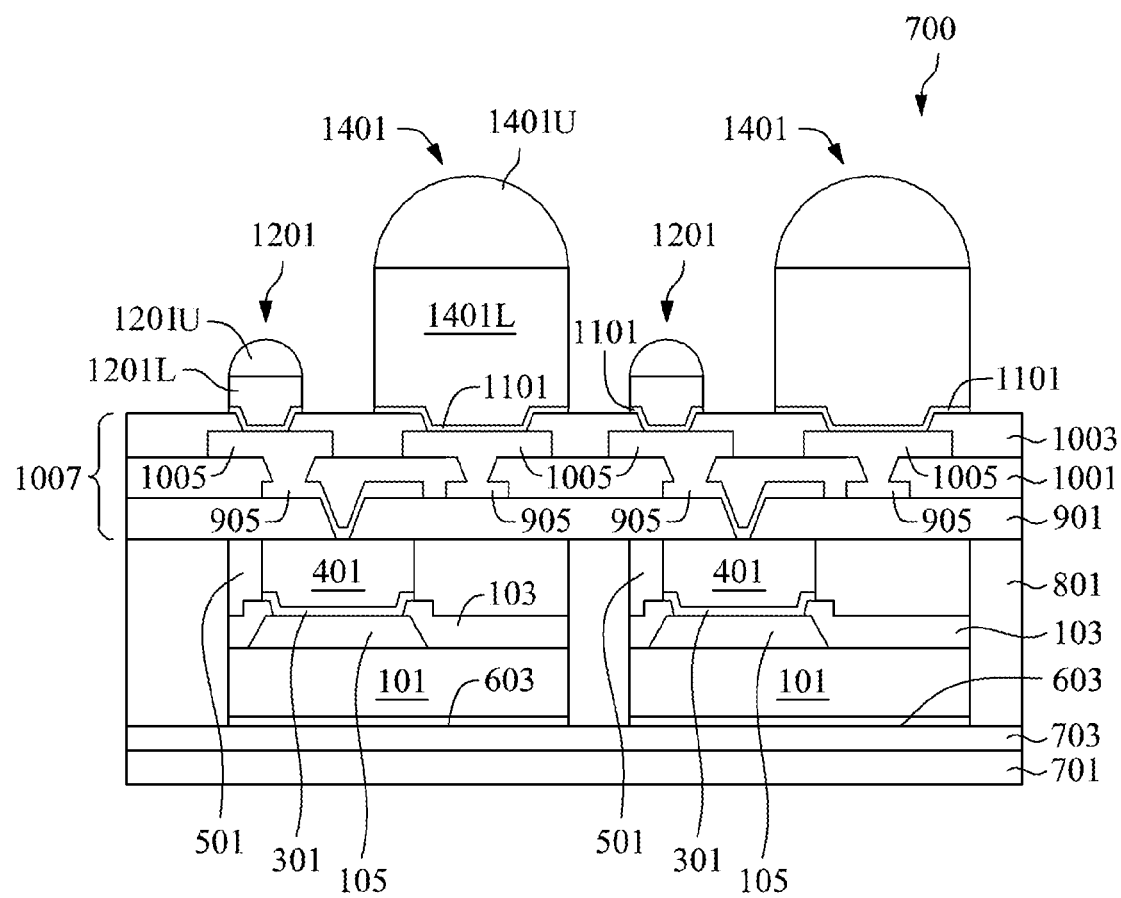

Referring to FIG. 15, in some embodiments, the packaged semiconductor device 700 is subjected to a solder reflow process. The solder reflow process causes the solder caps 1201U and 1401U to change shapes. Due to the surface tension, surfaces of the solder caps 1201U and 1401U that are not in contact with the conductive pillars 1201L and 1401L, respectively, assume a spherical shape as illustrated in FIG. 15. After the solder reflow process is completed, the carrier 701 is debonded from the back side of the packaged semiconductor device 700 as the packaged semiconductor device 700 is prepared for further processing. In some embodiments, the release layer 703 made of an LHTC material is irradiated to reduce its adhesive strength, and the carrier 701 is safely removed from the back side of the packaged semiconductor device 700.

Optionally, in some embodiments, after debonding the carrier 701 from the packaged semiconductor device 700, the adhesive 603 is removed from the back side of the packaged semiconductor device 700. The adhesive 603 may be removed using any suitable stripping process, which is subsequently followed by a cleaning process, such as, for example, the RCA clean, or the like.

Figure 16:
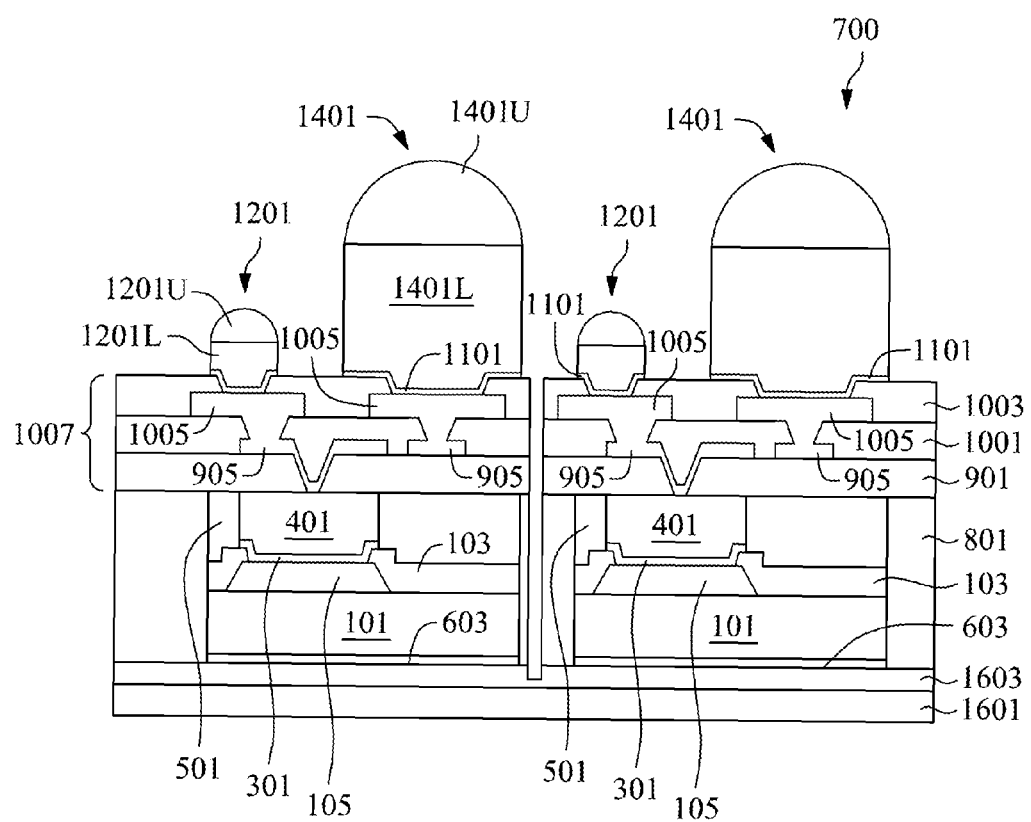

Referring to FIG. 16, the packaged semiconductor device 700 is diced to form individual integrated circuit packages. In some embodiments, the packaged semiconductor device 700 is attached to a dicing tape 1603 such as ultraviolet (UV) dicing tape (which loses its adhesive property when exposed to UV radiation). The dicing tape 1603 is attached to a frame 1601 which acts as a support during the dicing process. The frame 1601 may be a film frame or any suitable carrier to provide mechanical support for subsequent operations. The packaged semiconductor device 700 is then singulated into individual integrated circuit packages, for example, by sawing, laser ablation, or the like. Subsequently, each of the integrated circuit packages is tested to identify known good packages (KGPs) for further processing. For example, an exemplary KGP 1700 is illustrated in FIG. 17.

Figure 17:
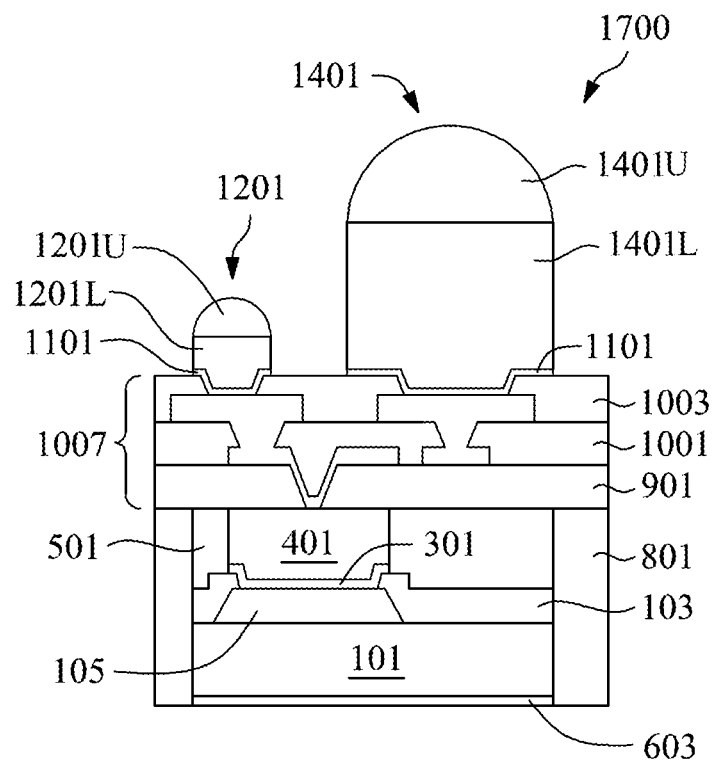

As illustrated in FIG. 17, the KGP 1700 comprises a single integrated circuit die (such as KGD 705) and two connectors (such as the first connector 1201 and the second connector 1401). One skilled in the art will recognize that the number of integrated circuit dies and the number of connectors are provided for illustrative purpose only and are not limiting the scope of the present disclosure. In other embodiments, the KGP 1700 may comprise appropriate number of integrated circuit dies and connectors depending on design requirements for the KGP 1700.

Figure 18:
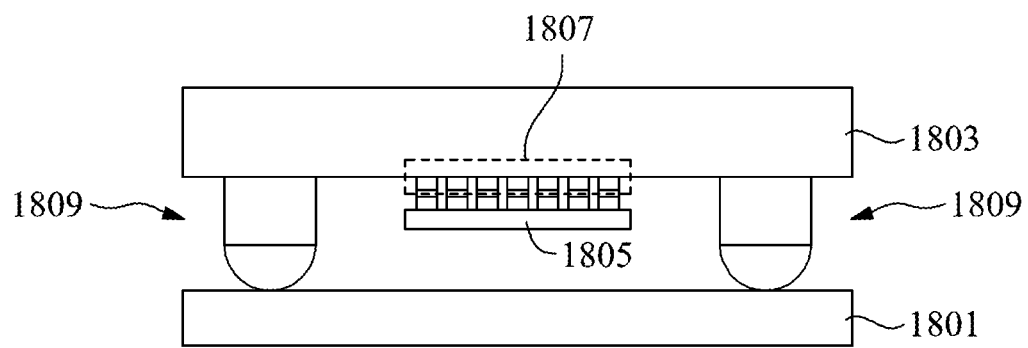
FIG. 18 is a cross-sectional view of an integrated circuit package mounted on a package substrate in accordance with some embodiments.

Referring further to FIG. 17, the second connector 1401 is larger than the first connector 1201 and, therefore, each connector may have a dedicated application. In some embodiments, connectors of a first type (such as the first connector 1201) are used for bonding the KGP 1700 to other integrated circuit dies, while connectors of a second type (such as the second connector 1401) are used for bonding the KGP 1700 to other integrated circuit packages or a package substrate. For example, FIG. 18 illustrates a KGP 1803 (similar to the KGP 1700) bonded to one or more integrated circuit dies 1805, and mounted on a package substrate 1801. In the illustrated embodiment, the KGP 1803 is formed using the method described above with respect to FIG. 1-17 and the description is not repeated herein. The KGP 1803 comprises first connectors 1807 (similar to the first connectors 1201) and the second connectors 1809 (similar to the second connectors 1401) formed using the method described above with reference to FIGS. 10-15 and the description is not repeated herein. In the illustrated embodiment, the KGP 1803 is mounted on the package substrate 1801 using the second connectors 1809, while the KGP 1803 and the one or more integrated circuit dies 1805 are bonded using the first connectors 1807. In some embodiments, the package substrate 1801 may be a laminated substrate, a printed circuit board, an interposer, an integrated circuit package, or the like. The one or more integrated circuit dies 1805 may be logic dies, memory dies, sensor dies, analog dies, or the like. In some embodiments, the KGP 1803 may comprise one or more logic dies and the one or more integrated circuit dies 1805 may be one or more memory dies.

Figure 19A:
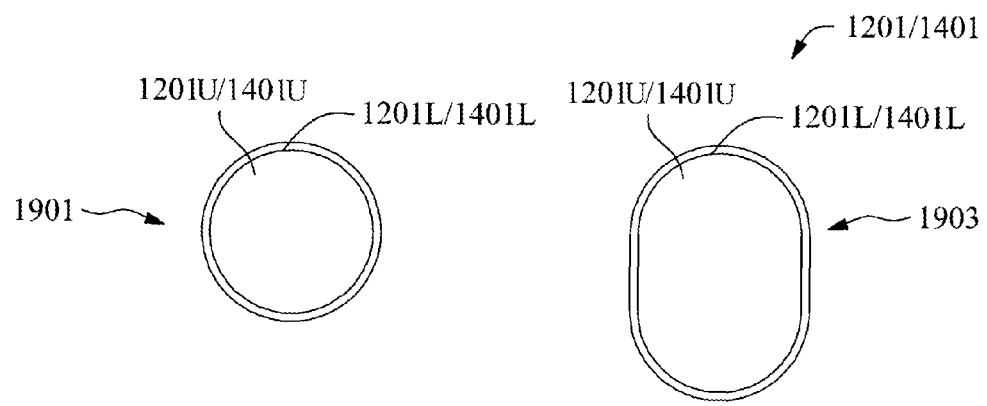
FIGS. 19A and 19B illustrate exemplary top and cross-sectional views, respectively, of connectors in accordance with some embodiments.

FIG. 19A illustrates exemplary top views of the first connector 1201 and the second connector 1401 (see FIG. 17) in accordance with some embodiments. In the illustrated embodiment, the first connector 1201 and the second connector 1401 may have a circular shape 1901 or an oval shape 1903 as viewed from above as illustrated in FIG. 19A. However, one skilled in the art will recognize that the exemplary top views shown in FIG. 19A are provided for illustrative purpose only and are not limiting the scope of the present disclosure. In other embodiments, top views of the first connector 1201 and the second connector 1401 may have variety of shapes, such as a square shape, a rectangular shape, a polygonal shape, or the like depending on design requirements for the first connector 1201 and the second connector 1401.

Figure 19B:
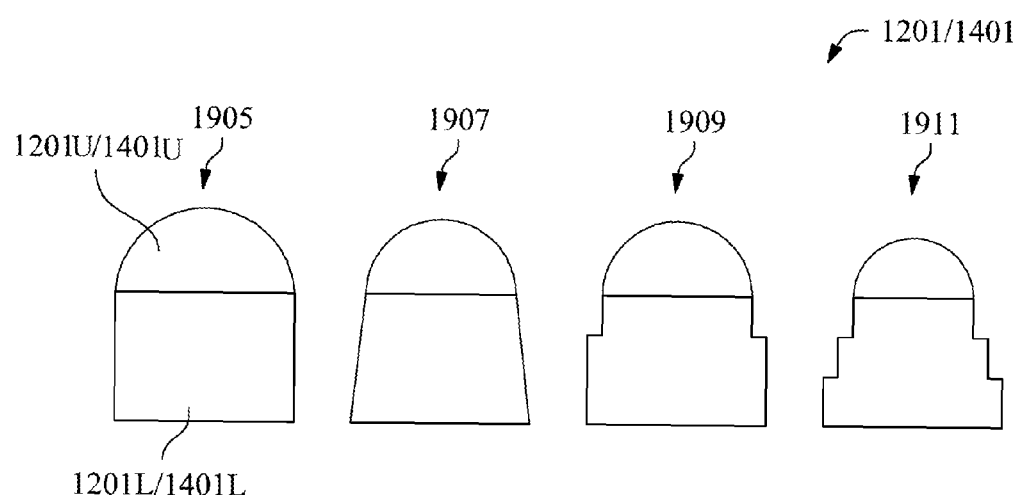

FIG. 19B illustrates various cross-sectional views of the first connector 1201 and the second connector 1401 (see FIG. 17). In some embodiments, the first connector 1201 and the second connector 1401 formed according to the method described above with respect to FIGS. 10-15 have a rectangular cross section 1905 illustrated in FIG. 19B. In some embodiments, widths of the first connector 1201 and the second connector 1401 gradually narrow/widen as the connectors extend away from a topmost surface of the KGP 1700 (see FIG. 17). Therefore, the first connector 1201 and the second connector 1401 may have a trapezoidal cross section 1907 illustrated in FIG. 19B. In other embodiments, widths of the first connector 1201 and the second connector 1401 may change in a step-like manner as the connectors extend away from a topmost surface of the KGP 1700 (see FIG. 17). For example, the first connector 1201 and the second connector 1401 may have a single-step trapezoidal cross section 1909 or a dual-step trapezoidal cross section 1911 illustrated in FIG. 19B.

Figure 20:
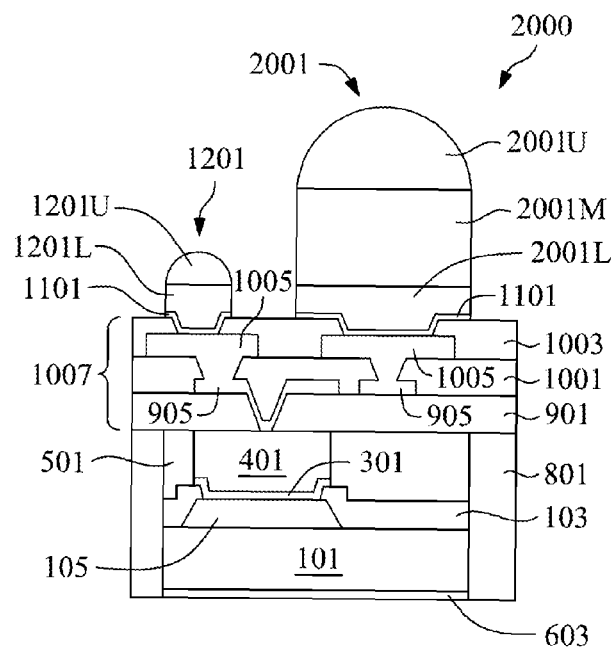
FIG. 20 is a cross-sectional view of an integrated circuit package in accordance with some embodiments.

FIG. 20 is a cross-sectional view of a KGP 2000 in accordance with some alternative embodiments. In some embodiment, the KGP 2000 may be formed using a method similar to that used to form the KGP 1700 (see FIGS. 1-17), and for the purpose of the following discussion, similar elements of the KGP 2000 and the KGP 1700 are referred by the same reference numerals. In the illustrated embodiment, the KGP 2000 comprises a second connector 2001 (similar to the second connector 1401 of the KGP 1700) having a second lower portion 2001L, a second middle portion 2001M, and a second upper portion 2001U. In some embodiments, the second lower portion 2001L and the second upper portion 2001U comprise a solder material, and the second middle portion 2001M comprises a conductive material. The second connector 2001 may be formed by depositing a layer of the conductive material between two layers of the solder material, wherein the layers of the solder material and the layer of the conductive material are formed using methods similar to those described above with reference to the second connector 1401 (see FIG. 14) and the description is not repeated herein.

Figure 21:
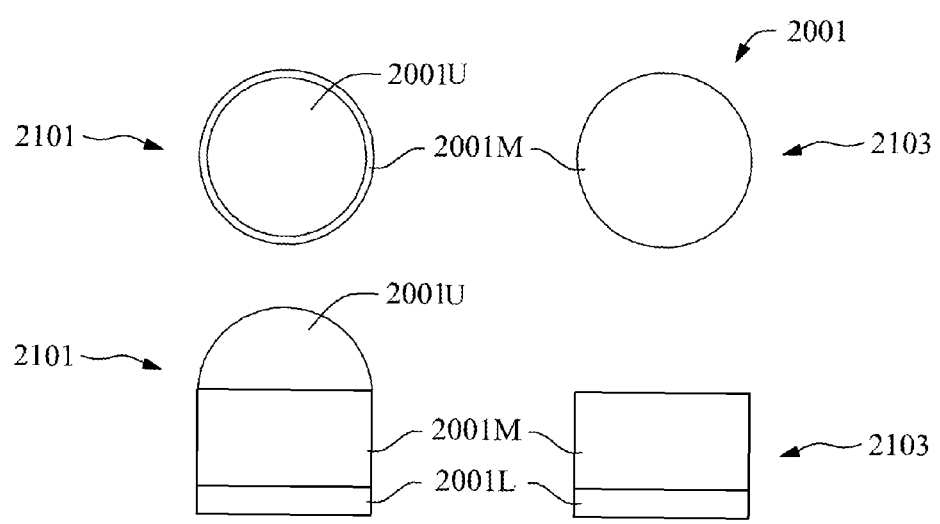
FIG. 21 illustrates exemplary top and cross-sectional views of a connector in accordance with some embodiments.

FIG. 21 illustrates exemplary top and respective cross-sectional views of the second connector 2001 (see FIG. 20) in accordance with some embodiments. In some embodiments, the second connector 2001 has a first structure 2101 comprising three portions, such as the second lower portion 2001L and the second upper portion 2001U formed of a solder material, and the second middle portion 2001M formed of a conductive material. In other embodiments, the second connector 2001 has a second structure 2103 comprising two portions, such as the second lower portion 2001L formed of a solder material and the second middle portion 2001M formed of a conductive material. As illustrated in FIG. 21, the first structure 2101 and the second structure 2103 have circular shapes as viewed from above. However, one skilled in the art will recognize that the exemplary top views shown in FIG. 21 are provided for illustrative purpose only and are not limiting the scope of the present disclosure. In other embodiments, the top view of the second connector 2001 may have variety of shapes, such as an oval shape, a square shape, a rectangular shape, a polygonal shape, or the like, depending on design requirements for the second connectors 2001.

Figure 22:
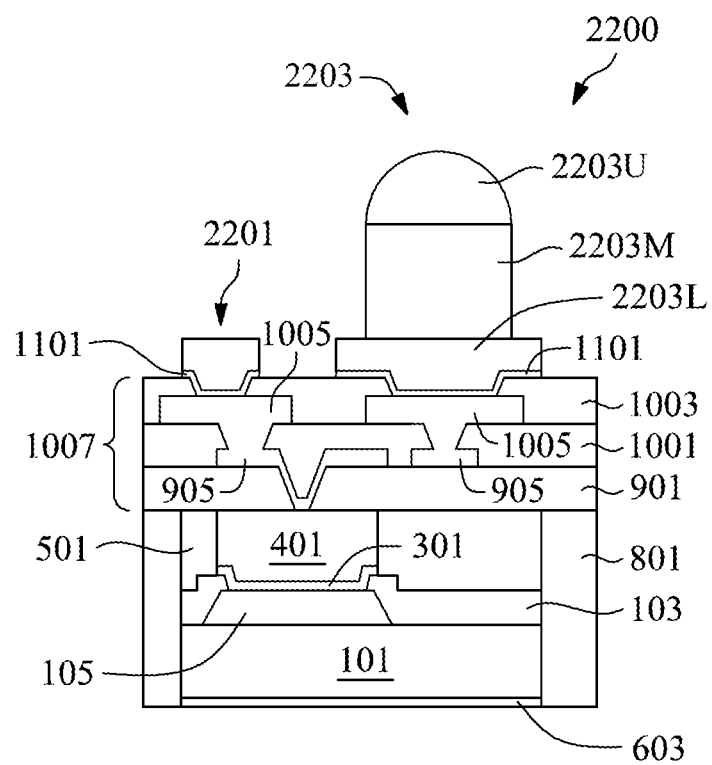
FIG. 22 is a cross-sectional view of an integrated circuit package in accordance with some alternative embodiments.

FIG. 22 is a cross-sectional view of a KGP 2200 in accordance with some alternative embodiments. In some embodiment, the KGP 2200 may be formed using a method similar to that used to form the KGP 1700 (see FIGS. 1-17), and for the purpose of the following discussion, similar elements of the KGP 2200 and the KGP 1700 are referred by the same reference numerals. In the illustrated embodiment, the KGP 2200 comprises a first connector 2201 (similar to the first lower portion 1201L of the first connector 1201) and a second connector 2203 having a second lower portion 2203L, a second middle portion 2203M, and a second upper portion 2203U. Moreover, a width of the second lower portion 2203L is larger than a width of the second middle portion 2203M. In other embodiments, the width of the second lower portion 2203L may be smaller than or equal to the width of the second middle portion 2203M.

Referring further to FIG. 22, in some embodiments, the first connector 2201 and the second lower portion 2203L of the second connector 2203 are formed at the same time using a same deposition method. Therefore, the first connector 2201 and the second lower portion 2203L of the second connector 2203 may have substantially similar heights. In some embodiments, the first connector 2201, the second lower portion 2203L and the second middle portion 2203M of the second connector 2203 comprise a conductive material, and the second upper portion 2203U of the second connector 2203 comprises a solder material. Various layers of the first connector 2201 and the second connector 2203 may be formed by depositing layers of a conductive material and/or a solder material, wherein the layers of the solder material and the conductive material are formed using methods similar to those described above with reference to the first connector 1201 (see FIG. 12) and the second connector 1401 (see FIG. 14) and the description is not repeated herein. In some embodiments, a topmost surface of the first connector 2201 may be planarized using, for example, a CMP process, or the like.

Figure 23:
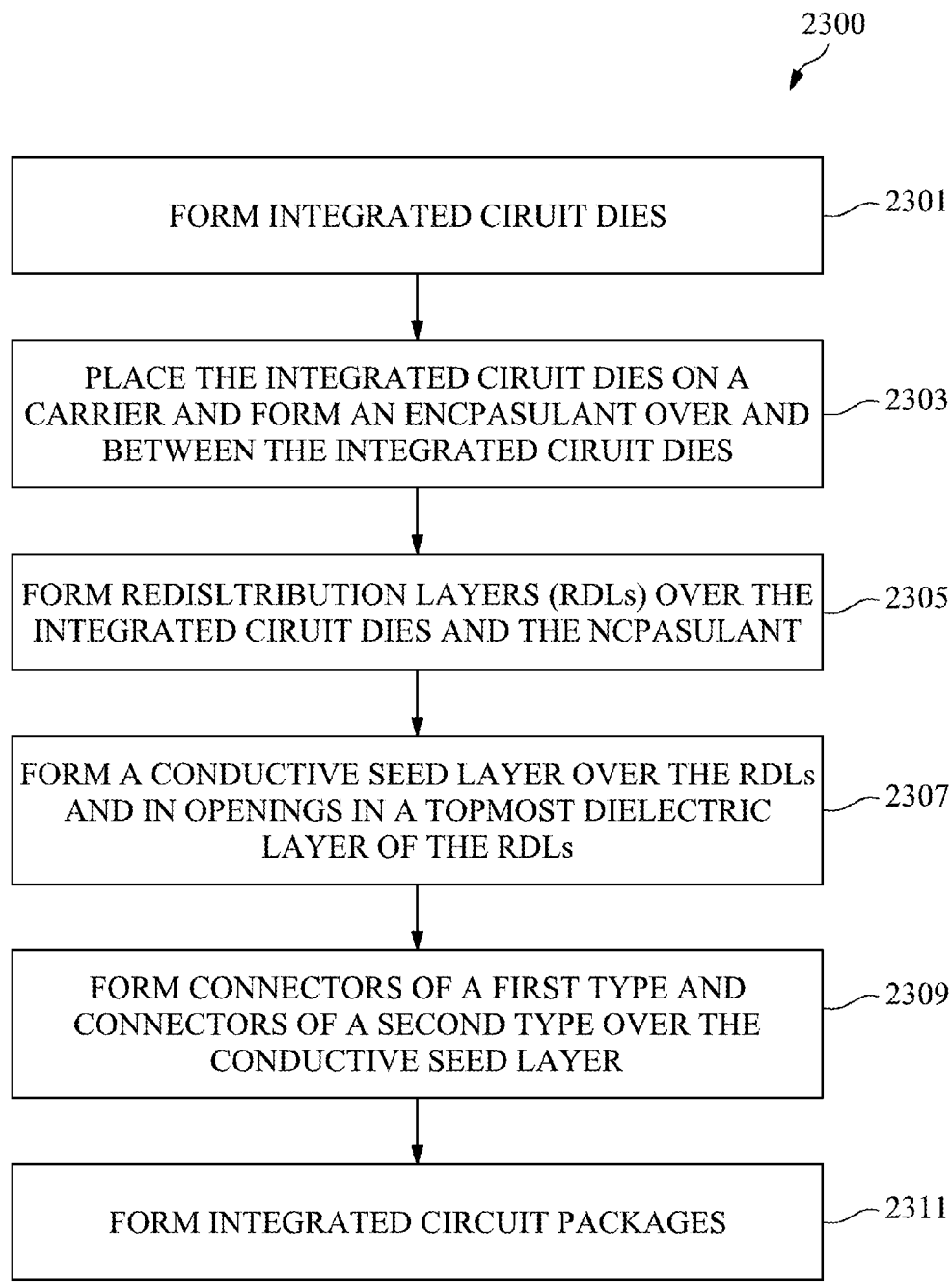
FIG. 23 is a flow diagram illustrating a method of forming integrated circuit packages in accordance with some embodiments.

FIG. 23 is a flow diagram illustrating a method 2300 of forming integrated circuit packages in accordance with some embodiments. The method starts at step 2301, wherein integrated circuit dies (such as the KGDs 705) are formed as described above with reference to FIGS. 1-6. At step 2303, the integrated circuit dies are placed on a carrier to start forming a packaged semiconductor device (such as the packaged semiconductor device 700) as described above with reference to FIG. 7. Subsequently, an encapsulant (such as the encapsulant 801) is formed over the integrated circuit dies and between the neighboring integrated circuit dies as described above with reference to FIG. 8. At step 2305, the encapsulant and the integrated circuit dies are planarized to expose contacts (such as the conductive vias 401) on top surfaces of the integrated circuit dies, and redistribution layers (such as the RDLs 1007) are formed over the planarized encapsulant and the planarized integrated circuit dies as described above with reference to FIGS. 9 and 10.

At step 2307, openings (such as fourth openings 1009 and fifth openings 1011) are formed in a topmost dielectric layer of the RDLs to expose portions of interconnects (such as the second conductive pattern 1005) in the RDLs as described above with reference to FIG. 10. Subsequently, a conductive seed layer (such as the second seed layer 1101) is formed over the RDLs and in the openings as described above with reference to FIG. 11. At step 2309, connectors of a first type (such as the first connectors 1201) and connectors of a second type (such as the second connectors 1401 or the second connectors 2001) are formed over the seed layer in the openings as described above with reference to FIGS. 11-15. Finally, at step 2311, the packaged semiconductor device is diced into individual packages (such as the KGP 1700, the KGP 1803, the KGP 2000, or the KGP 2200) as described above with reference to FIGS. 16 and 17.

Advantageous features of the embodiments may include, but are not limited to, an efficient and effective manufacturing process and cost reduction. In particular, by utilizing one seed layer for two plating processes to form the connectors of the first type and the connectors of the second type, number of process steps and manufacturing cost may be reduced. Another advantageous feature of some embodiments may include improved integration with existing process flows that are used to form various packaged semiconductor devices.

In an embodiment, a method comprises forming a first opening and a second opening on a first side of a workpiece, the workpiece comprising an integrated circuit die, the first opening exposing a first conductive feature, and the second opening exposing a second conductive feature. The method further comprises forming a seed layer on the first side of the workpiece, a first portion of the seed layer being in the first opening, and a second portion of the seed layer being in the second opening, and forming a first connector on the first portion of the seed layer, the first connector being electrically coupled to the first conductive feature. The method further comprises forming a second connector on the second portion of the seed layer after forming the first connector, the second connector being electrically coupled to the second conductive feature.

In another embodiment, a method comprises exposing a first conductive feature and a second conductive feature on a first side of a workpiece, the workpiece comprising one or more integrated circuit dies, and forming a seed layer on the first side of the workpiece. The method further comprises, forming a first connector on the first conductive feature, the first connector having a first size, at least a portion of the seed layer being interposed between the first connector and the first conductive feature, and forming a second connector on the second conductive feature, the second connector having a second size different from the first size, at least a portion of the seed layer being interposed between the second connector and the second conductive feature.

In yet another embodiment, a method comprises forming a first opening and a second opening through a dielectric layer on a first side of a workpiece, the workpiece comprising one or more integrated circuit dies, the first opening exposing a first conductive feature, and the second opening exposing a second conductive feature. The method further comprises forming a seed layer on the dielectric layer, in the first opening, and in the second opening, forming a first mask on the seed layer, the first mask masking the seed layer in the second opening and exposing the seed layer in the first opening, and forming a first connector on the seed layer in the first opening while exposed by the first mask. The method further comprises forming a second mask on the seed layer, the second mask masking the first connector and exposing the seed layer in the second opening, and forming a second connector on the seed layer in the second opening while exposed by the second mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first opening and a second opening on a first side of a workpiece, the workpiece comprising an integrated circuit die, the first opening exposing a first conductive feature, and the second opening exposing a second conductive feature;
forming a seed layer on the first side of the workpiece, a first portion of the seed layer being in the first opening, and a second portion of the seed layer being in the second opening;
forming a first connector on the first portion of the seed layer, the first connector being electrically coupled to the first conductive feature; and
after forming the first connector, forming a second connector on the second portion of the seed layer, the second connector being electrically coupled to the second conductive feature.

2. The method of claim 1, further comprising after forming the first connector and the second connector, removing portions of the seed layer.

3. The method of claim 1, wherein a width of the second connector is larger than a width of the first connector, and wherein a height of the second connector is larger than a height of the first connector.

4. The method of claim 1, wherein the seed layer comprises a copper layer formed over a titanium layer.

5. The method of claim 1, wherein the forming the first connector comprises:
masking the second portion of the seed layer and exposing the first portion of the seed layer; and
plating a first conductive material on the first portion of the seed layer.

6. The method of claim 5, further comprising forming a solder material on the first conductive material.

7. The method of claim 5, wherein the forming the second connector comprises:
masking the first connector and exposing the second portion of the seed layer; and
plating a second conductive material on the second portion of the seed layer.

8. The method of claim 7, further comprising forming a solder material on the second conductive material.

9. A method comprising:
exposing a first conductive feature and a second conductive feature on a first side of a workpiece, the workpiece comprising one or more integrated circuit dies;
forming a seed layer on the first side of the workpiece;
forming a first connector on the first conductive feature, the first connector having a first size, at least a portion of the seed layer being interposed between the first connector and the first conductive feature; and
after forming the first connector, forming a second connector on the second conductive feature, the second connector having a second size different from the first size, at least a portion of the seed layer being interposed between the second connector and the second conductive feature.

10. The method of claim 9, further comprising removing portions of the seed layer not interposed between the first connector and the first conductive feature, and not interposed between the second connector and the second conductive feature.

11. The method of claim 9, wherein the first connector is electrically coupled to the first conductive feature, and the second connector is electrically coupled to the second conductive feature.

12. The method of claim 9, wherein the exposing the first conductive feature and the second conductive feature on the first side of the workpiece comprises forming a first opening and a second opening though a dielectric layer on the first side of the workpiece.

13. The method of claim 9, wherein the forming the first connector comprises:
masking the seed layer on the second conductive feature and exposing the seed layer on the first conductive feature;
forming a first conductive material over the seed layer on the first conductive feature; and
forming a first solder material on the first conductive material.

14. The method of claim 13, wherein the forming the second connector comprises:
masking the first conductive material and exposing the seed layer on the second conductive feature;
forming a second conductive material over the seed layer over the second conductive feature; and
forming second solder material on the second conductive material.

15. A method comprising:
forming a first opening and a second opening through a dielectric layer on a first side of a workpiece, the workpiece comprising one or more integrated circuit dies, the first opening exposing a first conductive feature, and the second opening exposing a second conductive feature;
forming a seed layer on the dielectric layer, in the first opening, and in the second opening;
forming a first mask on the seed layer, the first mask masking the seed layer in the second opening and exposing the seed layer in the first opening;
forming a first connector on the seed layer in the first opening while exposed by the first mask;
forming a second mask on the seed layer, the second mask masking the first connector and exposing the seed layer in the second opening; and
forming a second connector on the seed layer in the second opening while exposed by the second mask.

16. The method of claim 15, wherein the forming the first connector comprises:
- plating a conductive material on the seed layer in the first opening; and
- forming a solder material on the conductive material.

17. The method of claim 15, wherein a width of the second connector is larger than a width of the first connector, and wherein a height of the second connector is larger than a height of the first connector.

18. The method of claim 15, wherein the first connector has a lower portion and an upper portion, the lower portion comprising a conductive material, and the upper portion comprising a solder material.

19. The method of claim 15, wherein the second connector has a lower portion and an upper portion, the lower portion comprising a conductive material, and the upper portion comprising a solder material.

20. The method of claim 15, wherein the second connector has a lower portion, an upper portion and a middle portion interposed between the lower portion and the upper portion, the lower portion and the upper portion comprising a solder material, and middle portion comprising a conductive material.

\* \* \* \* \*